United States Patent
Bishop et al.

(10) Patent No.: US 10,223,643 B1
(45) Date of Patent: Mar. 5, 2019

(54) REDUCTION AND/OR MITIGATION OF CROSSTALK IN QUANTUM BIT GATES

(71) Applicant: International Business Machines Corporation, Armonk, NY (US)

(72) Inventors: Lev Samuel Bishop, Dobbs Ferry, NY (US); Jay Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/721,194

(22) Filed: Sep. 29, 2017

(51) Int. Cl.
G06N 99/00 (2010.01)
H03K 3/013 (2006.01)
H03K 3/38 (2006.01)

(52) U.S. Cl.
CPC ........... *G06N 99/002* (2013.01); *H03K 3/013* (2013.01); *H03K 3/38* (2013.01)

(58) Field of Classification Search
CPC combination set(s) only.
See application file for complete search history.

(56) References Cited

U.S. PATENT DOCUMENTS 9,509,274 B2 * 11/2016 Naaman .................. H03H 7/20

OTHER PUBLICATIONS

McKay et al., "Efficient Z-Gates for Quantum Computing," Dec. 2016, 8 pages.
International Search Report and Written Opinion for PCT/EP2017/083556 dated Jun. 20, 2018, 13 pages.
Shulman et al., "Demonstration of Entanglement of Electrostatically Coupled Singlet-Triplet Qubits," Science, Apr. 13, 2012, vol. 336, No. 6078, pp. 202-205, 6 pages.
Wang et al., "Robust quantum gates for singlet-triplet spin qubits using composite pulses," Physical Review A, Atomic, Molecular, and Optical Physics, Feb. 12, 2014, vol. 89, No. 2, 23 pages.
"IBM Makes Quantum Computing Available on IBM Cloud to Accelerate Innovation," May 4, 2016, 4 pages. https://www-03_ibm.com/press/us/en/pressrelease/49661.wss.
Frisch, "IBM Q Quantum Computing," Jul. 12, 2017, 32 pages. https://www-01.ibm.com/events/wwe/grp/grp308.nsf/vLookupPDFs/07%20Quantum%20Computing%20cognitive%20event/$file/07%20Quantum%20Computing%20cognitive%20event.pdf.

* cited by examiner

*Primary Examiner* — An Luu
(74) *Attorney, Agent, or Firm* — Amin, Turocy & Watson, LLP

(57) ABSTRACT

Techniques facilitating reduction and/or mitigation of crosstalk in quantum bit gates of a quantum computing circuit are provided. A system can comprise a memory that stores computer executable components and a processor that executes the computer executable components stored in the memory. The computer executable components can comprise a signal generation component that implements a control sequence that comprises a single pulse type for a first quantum bit and at least a second quantum bit of a quantum circuit. The computer-executable components can also comprise a coordination component that synchronizes a first pulse of a first channel of the first quantum bit and at least a second pulse of at least a second channel of the second quantum bit. The coordination component can simultaneously apply the first pulse to the first quantum bit and at least the second pulse to at least the second quantum bit.

25 Claims, 10 Drawing Sheets

REDUCTION AND/OR MITIGATION OF CROSSTALK IN QUANTUM BIT GATES

BACKGROUND

In quantum hardware, a mechanism to implement gate operations and measurements on the hardware is to generate microwave pulses and send the microwave pulses into the quantum computing system. The microwave pulses can cause the state of the quantum computing system to update in a defined way. In an ideal case, the effect of the pulses on one quantum bit is independent of what is occurring on the other quantum bits. However, in operation, pulses sent down a line (e.g., through a port) that are intended for one quantum bit will hit unintended quantum bit. The pulse(s) received at the unintended qubit(s) is referred to as "crosstalk" or "control crosstalk." The control crosstalk can cause a frequency shift of the qubit based on a physical process known as the alternating current (AC)-stark shift. Accordingly, the subject disclosure relates to computer architecture, and more specifically to reduction and/or mitigation of crosstalk in quantum bit gates.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses, and/or computer program products that facilitate determination and correction of timing margin related errors of a hardware design are provided.

According to an embodiment, a system can comprise a memory that stores computer executable components and a processor that executes the computer executable components stored in the memory. The computer executable components can comprise a signal generation component that implements a control sequence that comprises a single pulse type for a first quantum bit and at least a second quantum bit of a quantum circuit. The computer-executable components can also comprise a coordination component that synchronizes a first pulse of a first channel of the first quantum bit and at least a second pulse of at least a second channel of the second quantum bit. The coordination component can simultaneously apply the first pulse to the first quantum bit and at least the second pulse to at least the second quantum bit. In an example, the coordination component can calibrate the first pulse of the first quantum bit in a presence of at least the second pulse of at least the second quantum bit in the quantum circuit. Thus, crosstalk can be removed from the quantum circuit.

Further, a synchronization of the pulses can facilitate continuous microwave pulsing. The continuous microwave pulsing can reduce crosstalk in one or more quantum bit gates of the quantum circuit. According to an implementation, the continuous microwave pulsing can render control crosstalk between the first quantum bit and at least the second quantum bit to be a similar crosstalk. Further to this implementation, the computer executable components can comprise a calibration component that can selectively remove the control crosstalk from the quantum circuit. In an additional or alternative implementation, the continuous microwave pulsing can render the control crosstalk as the similar crosstalk irrespective of a first state of the first quantum bit and a second state of at least the second quantum bit.

According to another embodiment, a computer-implemented method can comprise implementing, by a system operatively coupled to a processor, a control sequence that comprises a single pulse type for a first quantum bit and at least a second quantum bit of a quantum circuit. The computer-implemented method can also comprise synchronizing, by the system, a first pulse of a first channel of the first quantum bit and at least a second pulse of at least a second channel of the second quantum bit. Further, the computer-implemented method can comprise simultaneously applying, by the system, the first pulse to the first quantum bit and the second pulse to at least the second quantum bit. Based on the application of the pulses, crosstalk can be removed from the quantum circuit.

According to a further embodiment, a computer program product that removes crosstalk in quantum bit gates is provided. The computer program product can comprise a computer readable storage medium having program instructions embodied therewith, the program instructions can be executable by a processing component to cause the processing component to implement a control sequence that comprises a single pulse type for a first quantum bit and at least a second quantum bit of a quantum circuit. The program instructions can also cause the processing component to synchronize a first pulse of a first channel of the first quantum bit and at least a second pulse of at least a second channel of the second quantum bit. Further, the program instructions can also cause the processing component to simultaneously apply the first pulse to the first quantum bit and the second pulse to at least the second quantum bit. Thus, crosstalk in qubit gates can be eliminated through the use of continuous microwave pulsing.

An embodiment relates to a system that can comprise an electrical waveform generator that generates a single channel waveform to facilitate distribution to qubits of a quantum circuit. The system can also comprise one or more configurable amplitude scalers that scale the single pulse to facilitate calibration of the qubits. Further, the system can comprise one or more configurable phase-shifters that implement frame changes at the qubits. A first configurable amplitude scaler of the one or more configurable amplitude scalers and a first configurable phase-shifter of the one or more configurable phase-shifters can be utilized for a first qubit of the qubits. Further, a second configurable amplitude scaler of the one or more configurable amplitude scalers and a second configurable phase-shifter of the one or more configurable phase-shifters can be utilized for a second qubit of the qubits. The arbitrary waveform generator can construct a single pulse template from a Gaussian pulse. Further, the configurable phase-shifters can implement frame changes from respective phase rotations of the qubits. Accordingly, hardware efficiency can be achieved with the disclosed aspects.

Another embodiment relates to a system that can comprise an arbitrary waveform generator that generates a two channel waveform to generate pulses for qubits of a quantum circuit. The system can also comprise configurable attenuators that scale the pulses to facilitate calibration of the qubits. Pairs of attenuators of the configurable attenuators can be implemented at respective qubits of the qubits (e.g., two attenuators per qubit). Further, the system can comprise configurable phase-shifters that can implement frame changes at the qubits. Respective phase-shifters of the configurable phase-shifters can be implemented at respective qubits of the qubits (e.g., one phase shifter per qubit). In addition, the arbitrary waveform generator can generate a single pulse template. The single pulse template can be based on two channel pulse shaping. Thus, hardware efficiencies (e.g., a reduction in the amount of hardware utilized) can be achieved with the disclosed aspects.

DETAILED DESCRIPTION

Figure 1:
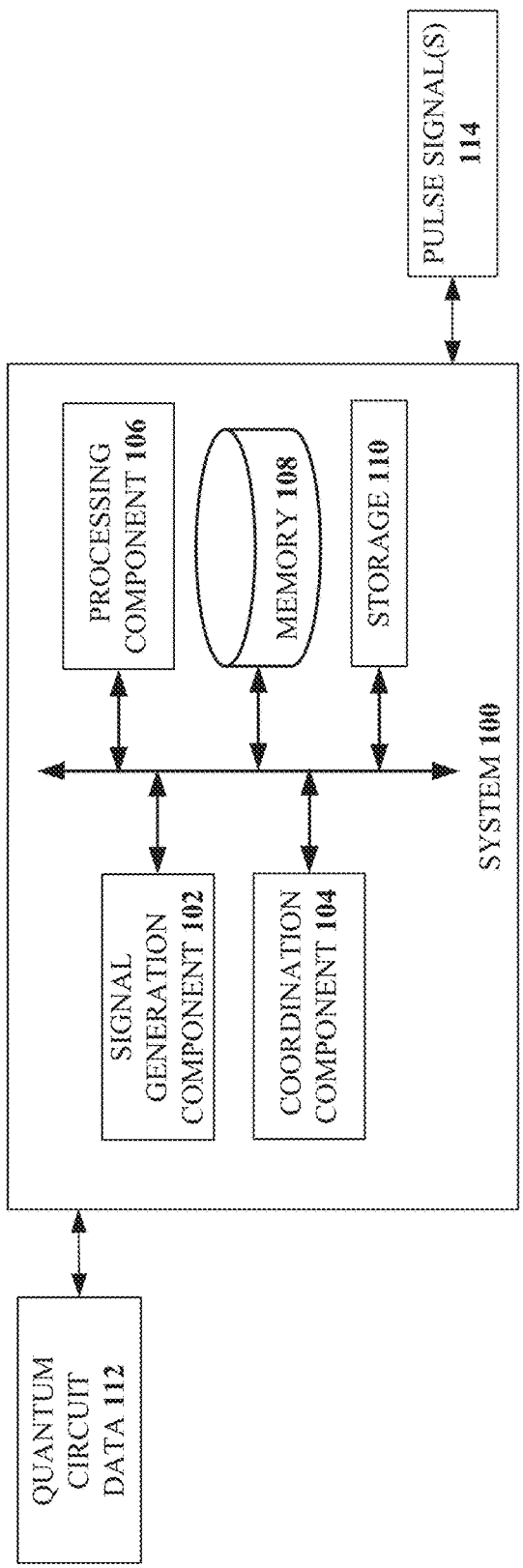
FIG. 1 illustrates a block diagram of an example, non-limiting, system that facilitates reduction and/or mitigation of crosstalk in quantum bit gates in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum computer can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with one other. For instance, a state of a first value (e.g., a value of "1" or a value of "0") can depend on a state of a second value. As such, a quantum computer can employ qubits to encode information rather than binary digital techniques that are based on the use of transistors.

A single-qubit superposition state can be geometrically represented as a point of the surface of a unit-sphere, referred to as a Bloch sphere. For a quantum computer, the ability to control the state of the qubit (e.g., transform the qubit state arbitrarily between two points on the Bloch sphere) can be accomplished by unitary transformations (e.g., gates). The unitary transformations or gates correspond to rotations of the state around different axes in a Bloch sphere representation. To rotate the states, pulses are sent though a port to a single qubit. However, the pulses can also be received at other qubits, which is referred to as crosstalk. Thus, conventional quantum systems are often inefficient due to the amount of crosstalk created. Further, conventional quantum systems can be improved.

Embodiments described herein comprise systems, computer-implemented methods, and computer program products that can mitigate and/or reduce crosstalk in quantum bit (qubit) gates. Specifically, one or more of the various aspects can mitigate and/or reduce crosstalk in qubit gates through the use of continuous microwave pulsing. For example, as discussed herein, the various aspects can reduce, mitigate, and/or eliminate crosstalk in qubit gates by using continuous microwave pulsing.

Thus, as will be discussed in further detail below, a qubit is never left in a completely idle state. Instead, even when a qubit is inactive, there is some form of "active idling." A single type of pulse, such as a pi/2 rotation type of pulse can be used. The single type of pulse can be combined with phase shifting to implement all possible single qubit gates. Thus, a crosstalk environment of a given gate can be (nearly always) predominately the same and, thus, the crosstalk can be largely calibrated away, which can significantly reduce and/or eliminate crosstalk in the quantum computing system. As such, accuracy of a quantum computing system and/or efficiency of a quantum computing system can be improved. Furthermore, performance of a quantum circuit and/or a quantum processor associated with a quantum computing system can be improved, efficiency of a quantum circuit and/or a quantum processor associated with a quantum computing system can be improved, timing characteristics of a quantum circuit and/or a quantum processor associated with a quantum computing system can be improved, power characteristics of a quantum circuit and/or a quantum processor associated with a quantum computing system can be improved, and/or another characteristic of a quantum circuit and/or a quantum processor associated with a quantum computing system can be improved.

FIG. 1 illustrates a block diagram of an example, non-limiting, system 100 that facilitates reduction and/or mitigation of crosstalk in quantum bit gates in accordance with one or more embodiments described herein. Aspects of systems (e.g., the system 100 and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the system 100 can be any type of component, machine, device, facility, apparatus, and/or instrument that comprises a processor and/or can be capable of effective and/or operative communication with a wired and/or wireless network. Components, machines, apparatuses, devices, facilities, and/or instrumentalities that can comprise the system 100 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

In various embodiments, the system 100 can be a quantum computing system associated with technologies such as, but not limited to, quantum circuit technologies, quantum processor technologies, quantum computing technologies, artificial intelligence technologies, medicine and materials technologies, supply chain and logistics technologies, financial services technologies, and/or other digital technologies. The system 100 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a quantum computing component, etc.) to carry out defined tasks related to machine learning.

The system 100 and/or components of the system 100 can be employed to solve new problems that arise through advancements in technologies mentioned above, computer architecture, and/or the like. One or more embodiments of the system 100 can provide technical improvements to quantum computing systems, quantum circuit systems, quantum processor systems, artificial intelligence systems and/or other systems. One or more embodiments of the system 100 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor, and/or improving power efficiency of the quantum processor.

In the embodiment shown in FIG. 1, the system 100 can comprise a signal generation component 102, a coordination component 104, a processing component 106, a memory 108, and/or a storage 110. The memory 108 can store computer executable components and instructions. The processing component 106 (e.g., a processor) can facilitate execution of the instructions (e.g., computer executable components and corresponding instructions) by the signal generation component 102, the coordination component 104, and/or other system components. As shown, in some embodiments, one or more of the signal generation component 102, the coordination component 104, the processing component 106, the memory 108, and/or the storage 110 can be electrically, communicatively, and/or operatively coupled to one another to perform one or more functions of the system 100.

The signal generation component 102 can receive, as input data, quantum circuit data 112. For example, the quantum circuit data 112 can be a machine-readable description of a quantum circuit. The quantum circuit can be a model for one or more quantum computations associated with a sequence of quantum gates. In one example, the quantum circuit data can include textual data indicative of a text-format language (e.g., a QASM text-format language) that describes a quantum circuit. For instance, the textual data can, for example, textually describe one or more qubit gates of a quantum circuit associated with one or more qubits.

In a piece of quantum hardware, which is a superconducting qubit space, a mechanism to implement gate operations and measurements on the hardware is to generate microwave pulses and send the microwave pulses into the quantum computing system (e.g., via the signal generation component 102). The microwave pulses can cause the state of the quantum computing system to update in a defined way. In an ideal case, the effect of each of the pulses on one qubit is independent of what is occurring on the other qubits. However, in operation, pulses sent down a line (e.g., through a port) that are intended to hit one qubit will (despite significant attenuation due to careful microwave design) hit unintended qubits. The pulse(s) received at the unintended qubit(s) is referred to as control crosstalk. When the unintended qubits have similar frequencies (as they do in a cross-resonance coupling design) the control crosstalk can cause a frequency shift of the qubit based on a physical process known as the AC-stark shift.

Further, when performing an operation on a first qubit, the effect of the pulse on the first qubit can be different from what was intended based on what is occurring on a second qubit and/or the other qubits in the quantum computing system. In some situations, the biggest difference is whether the other qubits are idle or if there is an operation being performed on the other qubits. Accordingly, the aspects discussed herein can implement an active idling on qubits that are in idle mode in order to reduce and/or mitigate crosstalk.

For example, instead of leaving a qubit in an idle state, the various aspects discussed herein can be constantly performing operations on all the qubits. In this manner, an operation on a first qubit happens in the presence of one or more operations on the other qubits so that the environment is constant. Since a qubit is never left completely idle, as discussed herein, even when the qubit is inactive, there is active idling being performed. For example, the signal generation component 102 can be applying one or more pulses to the one or more idle qubits in order to keep those qubits still. Further, there is a single type of pulse used, which can be a pi/2 rotation combined with phase shifting. The crosstalk environment of a given gate is therefore almost the same and, thus, the crosstalk can be calibrated out of the quantum computing circuit.

In one or more embodiments, the signal generation component 102 can output one or more pulse signals 114. For example, the signal generation component 102 can generate a control sequence that comprises a single pulse type for a first quantum bit (qubit) and at least a second quantum bit of a quantum circuit. For example, the quantum circuit can comprise more than two quantum bits (or qubits) and the single pulse type can be the same for the two or more qubits. In an example, the single pulse type can be a pi/2 rotation.

The coordination component 104 can synchronize a first pulse of a first channel of the first quantum bit and at least a second pulse of at least a second channel of the second quantum bit. If there are more than two quantum bits, the coordination component 104 can synchronize the subsequent pulses of the subsequent qubits with the first pulse, the second pulse, and/or one or more subsequent pulses. According to some implementations, the coordination component 104 can simultaneously apply the first pulse to the first quantum bit and at least the second pulse to at least the second quantum bit. Further, in some implementations, the coordination component 104 can simultaneously apply subsequent pulses to subsequent quantum bits. Thus, the coordination component 104 can synchronize the pulses between multiple qubit channels.

In certain embodiments, the signal generation component 102 can generate the one or more pulse signals 114 based on classifications, correlations, inferences and/or expressions associated with principles of artificial intelligence. For instance, the signal generation component 102, as well as other system components, can employ an automatic classification system and/or an automatic classification process to determine which pulses to apply to the various qubits. In one example, the signal generation component 102 can employ a probabilistic and/or statistical-based analysis (e.g., factoring into the analysis utilities and costs) to learn and/or generate inferences with respect to the respective states of the one or more qubits and corresponding pulses that should be applied to the one or more qubits. In an aspect, the signal generation component 102 can comprise an inference component (not shown) that can further enhance automated aspects of the signal generation component 102 utilizing in part inference based schemes to facilitate learning and/or generating inferences associated with the pulses that should be applied in order to achieve active idling of inactive qubits. The signal generation component 102 can employ any suitable machine-learning based techniques, statistical-based techniques and/or probabilistic-based techniques. For example, the signal generation component 102 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the signal generation component 102 can perform a set of machine learning computations associated with generation of pulse signals. For example, the signal generation component 102 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to determine the pulse signals 114.

It is to be appreciated that the system 100 (e.g., the signal generation component 102 and/or the coordination component 104, as well as other system components) performs a qubit state analysis and/or generates a pulse signal that cannot be performed by a human (e.g., is greater than the capability of a single human mind). For example, an amount of data processed, a speed of data processed and/or data types of data processed by the system 100 (e.g., the signal generation component 102 and/or the coordination component 104) over a certain period of time can be greater, faster, and different than an amount, speed, and data type that can be processed by a single human mind over the same period of time. The system 100 (e.g., the signal generation component 102 and/or the coordination component 104) can also be fully operational towards performing one or more other functions (e.g., fully powered on, fully executed, etc.) while also performing the above-referenced quantum circuit analysis and/or pulse signal generation process. Moreover, pulse signals 114 generated and coordinated by the system 100 (e.g., the signal generation component 102 and/or the coordination component 104) can include information that is impossible to obtain manually by a user. For example, a type of information included in the quantum circuit data 112, a variety of information associated with the quantum circuit data 112, and/or optimization of the quantum circuit data 112 to generate and output the one or more pulse signals 114 can be more complex than information that can be obtained manually and processed by a user.

Figure 2:
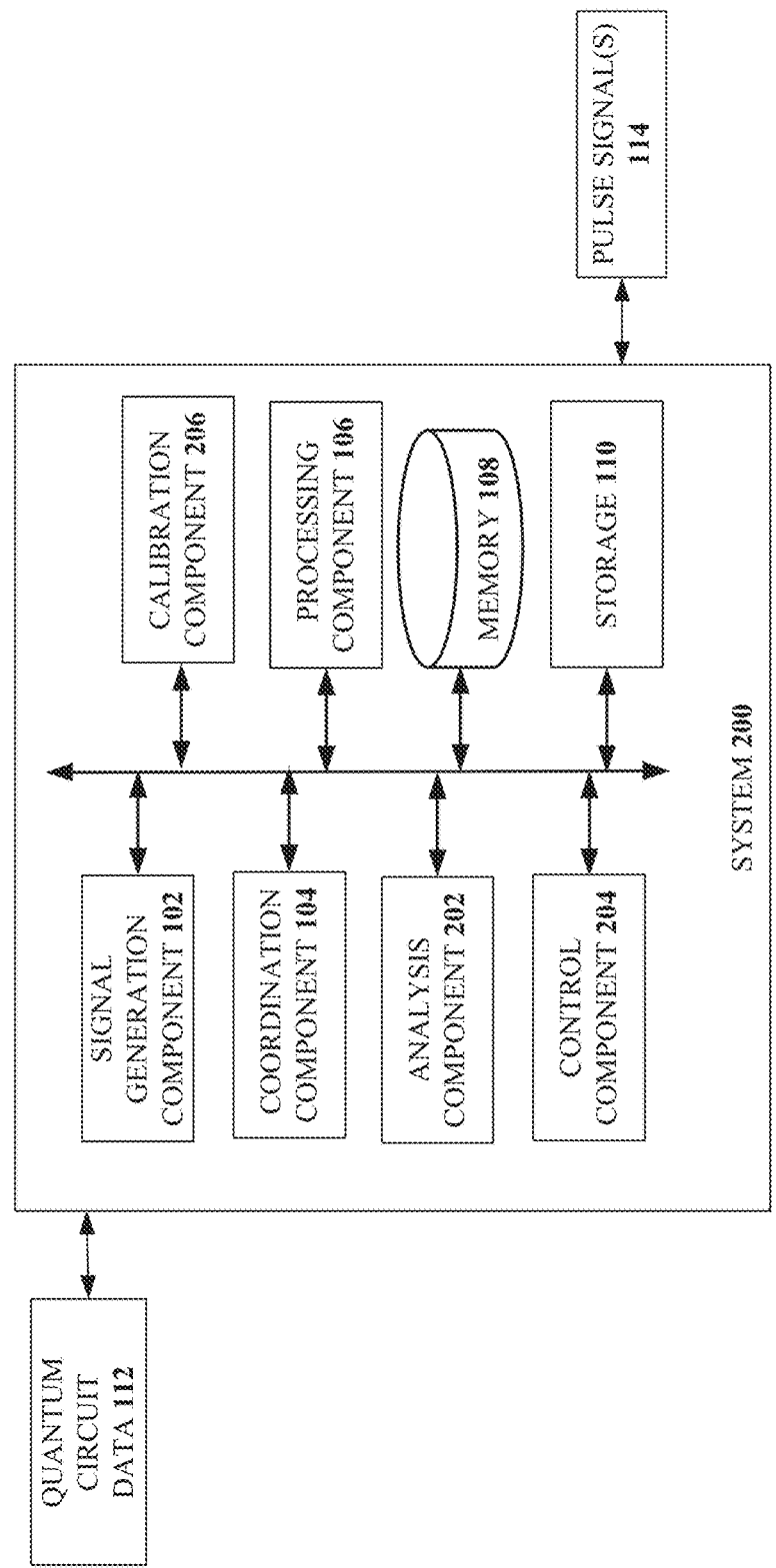
FIG. 2 illustrates a block diagram of an example, non-limiting, system that implements gate control in accordance with one or more embodiments described herein.

FIG. 2 illustrates a block diagram of an example, non-limiting, system 200 that implements gate control in accordance with one or more embodiments described herein. Repetitive description of like elements employed in other embodiments described herein is omitted for sake of brevity.

The system 200 can comprise one or more of the components and/or functionality of the system 100, and vice versa. The various aspects discussed herein can be utilized to facilitate a quantum circuit hardware design that is resilient to crosstalk. For example, as discussed, classical crosstalk, which can occur when a pulse is sent down the line through a port and intended to hit one qubit. Despite significant attenuation based on an efficient microwave design, the pulse can still affect the other unintended qubits to some extent (e.g., control crosstalk). When the unintended qubits have similar frequencies, the control crosstalk can cause a frequency shift of the qubit based on a physical process known as the AC-stark shift. At the lowest order, the effect of the crosstalk due to the unwanted pulses is to shift the effective frequency of the unaddressed qubits.

In addition, an arbitrary single qubit gate can be represented as:

$$U(a,b,c) = Z(a).X90.Z(b).X90.Z(c)$$

which is a three-parameter unitary operation. Thus, the arbitrary single qubit gate can be broken down as a phase rotation, followed by an X90 gate, followed by another phase rotation, followed by an X90 gate, followed by another phase rotation.

In some cases, phase rotations (e.g., Z gates) can be implemented without inducing crosstalk. In superconducting qubits this can be achieved by a frame update. For example, the frame update can include changing the frame of the follow gates in a manner that is consistent with the application of the gate. The X90 gate is usually achieved by driving with amplitude $\Omega$ and frequency $\omega_q$ for a time gate $t_g$ and initial phase $\phi$ which depends on the previous gates (and can be easy to track). To lowest order, the crosstalk error can be proportional to $\Omega^2$ and has no information about the phase $\phi$.

As discussed herein, the various aspects can reduce, mitigate, or eliminate crosstalk in qubit gates by using continuous microwave pulsing. The system 200 of FIG. 2 can comprise an analysis component 202 that can analyze the quantum circuit data 112. For example, the analysis component 202 can determine the respective states of the one or more qubits. In another example, the analysis component 202 can determine how to selectively calibrate respective pulses of the one or more qubits in the presence of pulses applied, or expected to be applied, to the other qubits. The analysis component 202 and the signal generation component 102 can share information in order to implement a control sequence that comprises a single pulse type for qubits of a quantum computing system. According to various implementations, the single pulse type can be a pi/2 rotation pulse type.

A control component 204 can combine frame changes to the control sequence. For example, a combination of the control sequence and the frame changes can implement a single quantum bit SU(2) gate control. According to some implementations, the pulses can be two X90 pulses, for example.

The coordination component 104 can synchronize the respective pulses on the one or more channels. Synchronization of the pulses can facilitate continuous microwave pulsing. Further, the continuous microwave pulsing can reduce crosstalk in one or more quantum bit gates of the quantum circuit.

In an example, the continuous microwave pulsing can render control crosstalk between the first quantum bit and at least the second quantum bit to be a similar crosstalk. Further to this example, a calibration component 206 can selectively remove the control crosstalk from the quantum circuit. Further to this example, the continuous microwave pulsing can render the control crosstalk as the similar crosstalk irrespective of a first state of the first quantum bit and a second state of at least the second quantum bit (or respective states of subsequent quantum bits).

According to some implementations, the coordination component 104 can calibrate the first pulse of the first quantum bit in a presence of at least the second pulse of at least the second quantum bit in a quantum circuit. In further implementations, the coordination component 104 can calibrate the first pulse of the first quantum bit in the presence of, and with consideration of, multiple other quantum bits. For example, the coordination component 104 can calibrate a qubit while the other qubits are running.

In accordance with an implementation, the coordination component 104 can implement an identity gate via active idling. The active idling can eliminate an absence of pulses for other quantum bits within the quantum circuit. Thus, the pulses on the other quantum bits are not completely turned off. According to an implementation, the coordination component 104 can implement the active idling with a random active idle sequence. Thus, a phase of the active idle sequence can be randomized to reduce systematic errors within the quantum circuit. In an alternative or additional implementation, the coordination component 104 can use high-order echo/decoupling sequences for higher-order suppression based on an idle period being longer than a defined idle time. The defined idle time can be determined a priori and can be defined as longer than a set amount of time.

Figure 3:
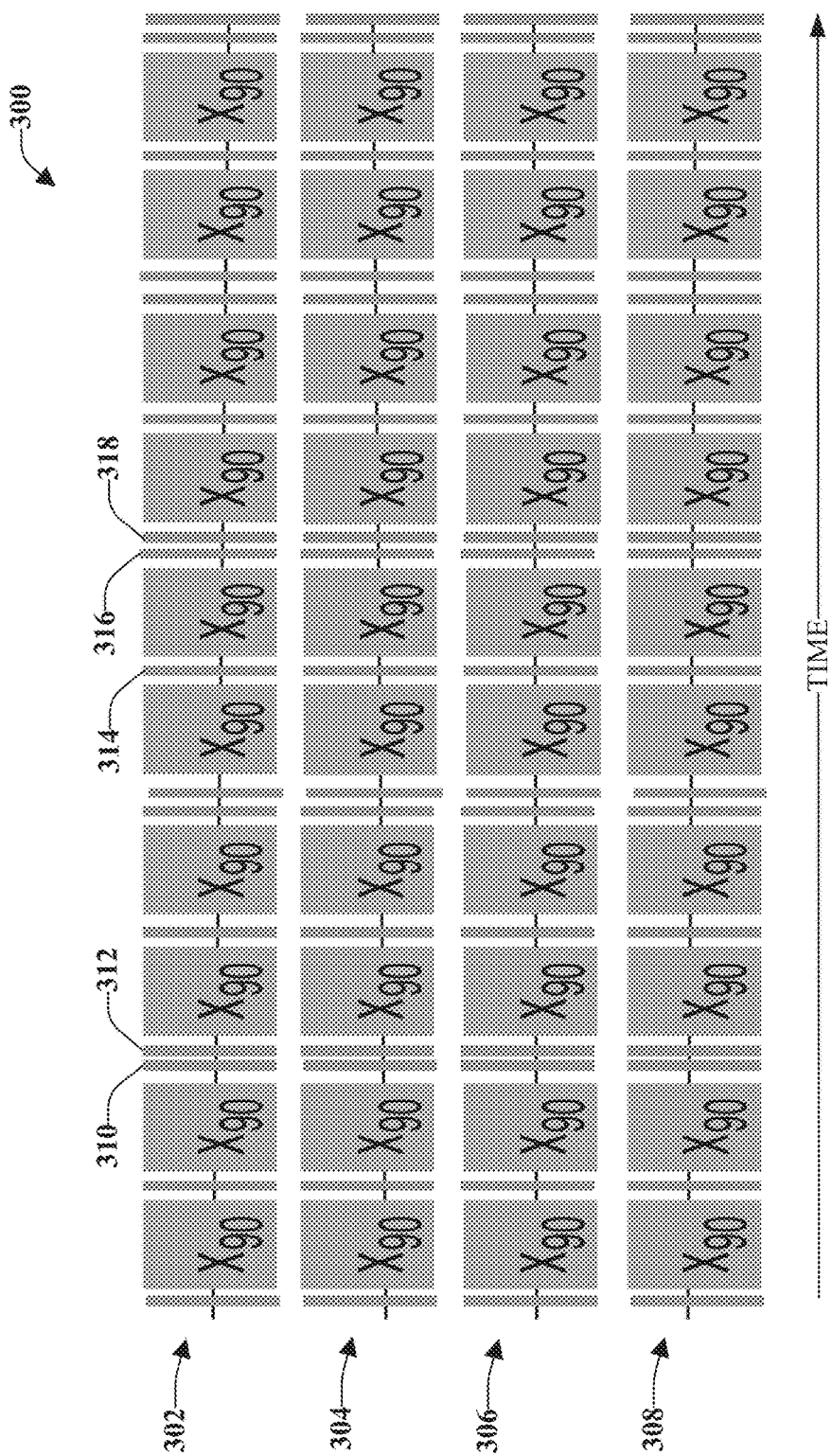
FIG. 3 illustrates an example, non-limiting, timing diagram for a single qubit control system in accordance with one or more embodiments described herein.

FIG. 3 illustrates an example, non-limiting, timing diagram 300 for a single qubit control system in accordance with one or more embodiments described herein. Time is illustrated on the horizontal axis and is from left to right. Also illustrated are timelines of operations on four qubits. For example, a first timeline of operations for a first qubit is illustrated at 302. A second timeline of operations for a second qubit is illustrated at 304 and a third timeline of operations for a third qubit is illustrated at 306. Further, a fourth timeline of operations for a fourth qubit is illustrated at 308.

Zero duration vertical bars, a few of which are labeled at 310, 312, 314, 316, and 318, represent the logical updates to the phase of the qubits. The zero duration vertical bars do not generate any pulses. The boxes labeled "X90" represent the fixed X90 rotation.

The timeline of operations can be arranged such that there are pairs of operations that generate a general single qubit unitary operation. Thus, the operations can be performed in lock step so that no matter what is occurring on the qubits, the qubits are having their respective X90 rotation applied simultaneously with the other three qubits. Accordingly, all single qubit gates can be synchronized so that the control crosstalk is the same no matter what the state of the qubit and the effects of crosstalk can be calibrated away (e.g., by the calibration component 206). Therefore, calibration is performed on only one gate X90 for each qubit. In other words, if there are n qubits, where n is an integer, there are only n gates to be calibrated. This is much simpler than previous systems that have to perform more than one calibration per qubit, which can result in calibration of a large number of gates (e.g., a multiple of n gates).

Due to the simplified nature of calibration of only one gate per qubit (e.g., a first gate of a first qubit, a second gate of a second qubit, and so on), the phases can be used to make more complicated pulses and, therefore, additional types of crosstalk (e.g., quantum crosstalk, composite pulses) can be calibrated. Further, although this has been discussed with respect to a single qubit system, the various aspects can be applied to a multi-qubit setting.

Figure 4:
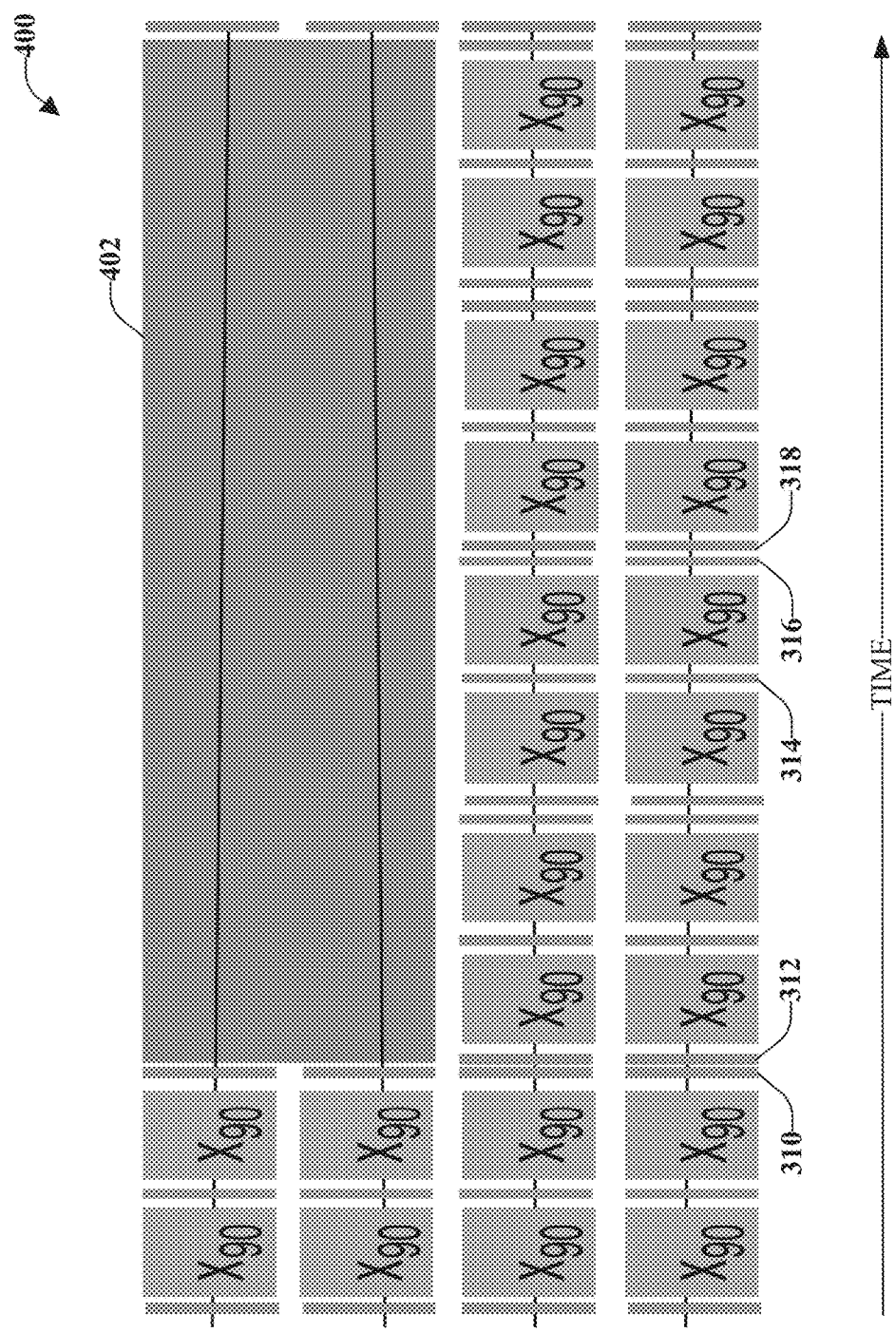
FIG. 4 illustrates an example, non-limiting, timing diagram for two qubit gates in accordance with one or more embodiments described herein.

FIG. 4 illustrates an example, non-limiting, timing diagram 400 for two qubit gates in accordance with one or more embodiments described herein. Repetitive description of like elements employed in other embodiments described herein is omitted for sake of brevity.

Similar to FIG. 3, time is illustrated on the horizontal axis and is from left to right. Generally, two qubit gates take longer to process than single qubit gates. Accordingly, in FIG. 4, a first qubit and a second qubit that are undergoing two qubit gates are represented by the long box 402. The timeline of operations can be arranged so that a duration of the two-qubit gate is an integer multiple of a single qubit gate. In other words, the two-qubit gate time can be chosen as an integer multiple of the single qubit time so that everything lines up properly. Accordingly, at the end of the process, the operations can remain in lock step so that all the qubits continue to operate in a synchronized fashion. In an example, during the two qubit gates, on all remaining qubits a sequence is applied that implements the identity. According to some implementations, this can be a high-order echo/dynamical decoupling sequence.

Further, calibration is performed on only one gate X90 for each qubit. In other words, if there are n qubits, where n is an integer, there are only n gates that need to be calibrated. Further, the phases can be used to make more complicated pulses, which can address quantum crosstalk or other crosstalk.

In further detail, during the two-qubit gate on the first qubit and the second qubit, the remaining qubits can be performing a sequence that implements the identity. A simple way of performing this is for the single qubit operations to implement respective qubit identities. According to some implementations, an identity can be implemented over multiple qubits for a given amount of time, which is referred to as high order echoes or dynamic decoupling sequences.

Thus, the operations can perform an identity operation and a more robust implementation of the identity according to various implementations. However, only one X90 operation for each of the gates needs to be calibrated. Further, as discussed, the phases can be made more complex in order to address other types of crosstalk, such as quantum crosstalk.

Accordingly, as illustrated and described with respect to FIG. 3 and FIG. 4, the operations are kept in lock-step so that the environment is the same across qubits. In addition, by keeping the operations in lock-step, the operations can be performed with a single type of gate.

In accordance with some implementations, an echo sequence can be implemented on idle qubits with a two-qubit gate is in process. The two-qubit gate time can be chosen to be an integer multiple of the single qubit gate time. Additionally or alternatively, optimized dynamical decoupling sequences for higher-order echoing can be performed.

Figure 5:
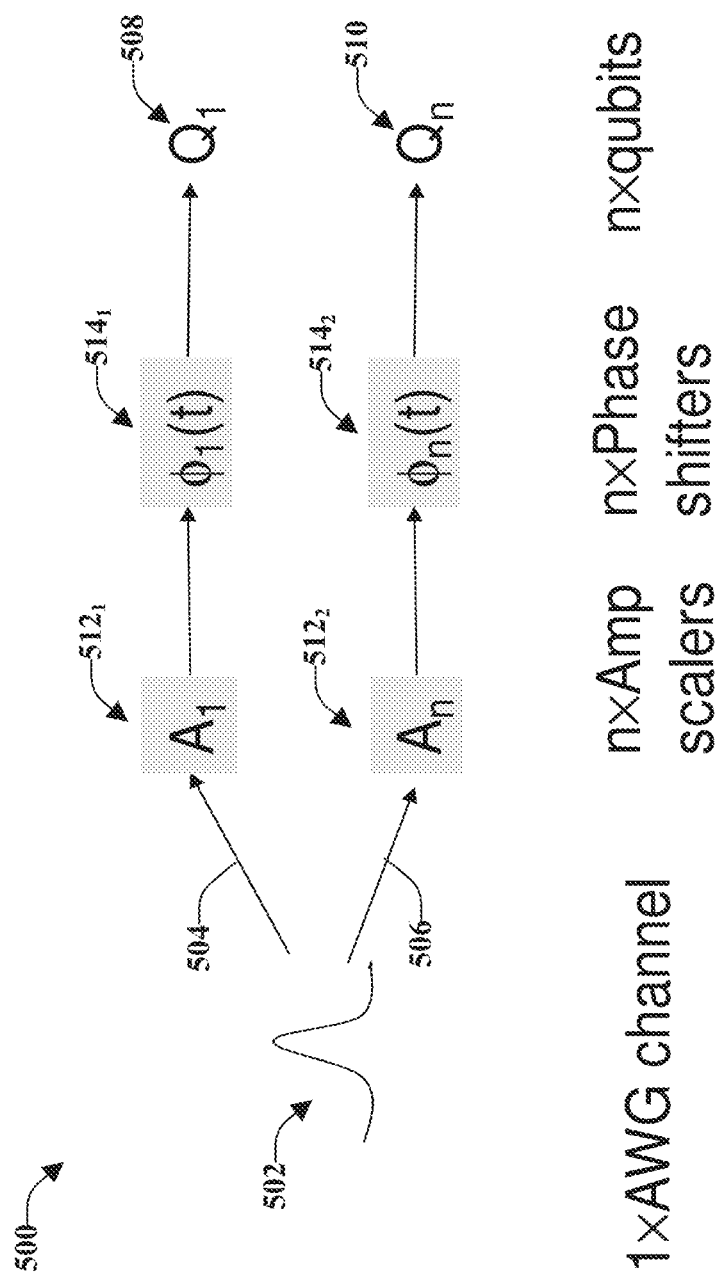
FIG. 5 illustrates an example, non-limiting, schematic representation of a hardware efficient implementation in accordance with one or more embodiments described herein.

FIG. 5 illustrates an example, non-limiting, schematic representation 500 of a hardware efficient implementation in accordance with one or more embodiments described herein. Through utilization of the disclosed aspects, hardware efficiencies can be achieved, since qubits use a single type of gate (e.g., an X90 gate). For example, instead of having multiple channels for each qubit of arbitrary waveform generation (AWG), a single AWG channel 502 of the X90 pulse can be utilized. Then, as illustrated by arrows 504 and 506, the single AWG channel 502 can be scaled and shifted separately for the qubits.

For example, the single AWG channel 502, which can be generated by a single electrical waveform generator, can be split into a first channel for a first qubit 508 and into at least a second channel for an Nth qubit 510, where N is an integer. Then respective scaling operations $512_1$ and $512_2$ can be performed and respective phase shift operations $514_1$ and $514_2$ can be performed. According to an implementation, the electrical waveform generator can be a fast arbitrary waveform generator.

Accordingly, in this implementation there is only one electrical waveform channel to generate the X90 pulse for all n qubits. Further, there can be one medium-rate (e.g., 1/pulse-rate) configurable phase shifter per qubit to implement the Z gates. In addition, for non-identical qubits/lines one slow (DC) configurable attenuator per qubit can be utilized to scale the pulse to facilitate qubit calibration. In an alternative implementation, two slow (DC) configurable attenuators to separately scale the quadratures, in the case of Derivative Removal via Adiabatic Gate (DRAG) pulse shaping can be utilized, which will be discussed with respect to FIG. 6.

As discussed herein, the implementation of FIG. 5 comprises a hardware savings as compared to traditional methods where each qubit receives one or two channels, depending on the design. Further, the disclosed implementation utilizes a slower configurable phase shifter per qubit, which can be less expensive than a full general arbitrary waveform generator.

Figure 6:
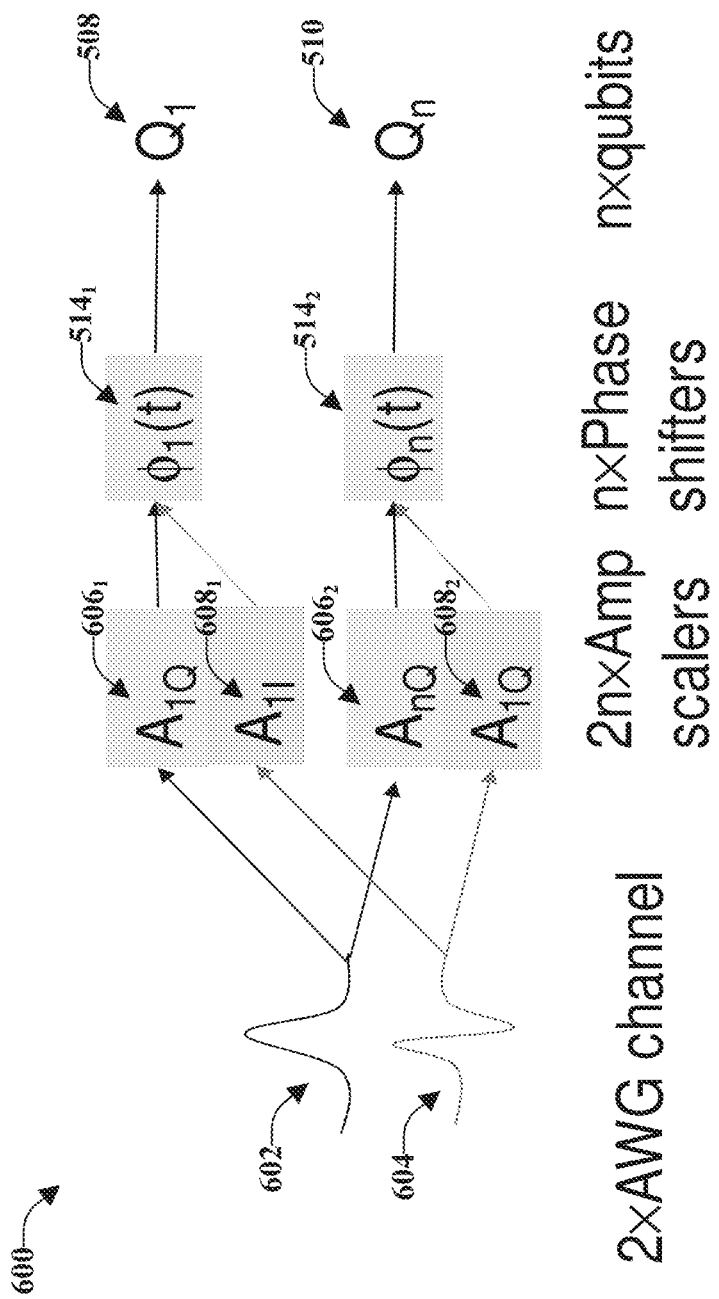
FIG. 6 illustrates an example, non-limiting, schematic representation of another hardware efficient implementation in accordance with one or more embodiments described herein.

FIG. 6 illustrates an example, non-limiting, schematic representation 600 of another hardware efficient implementation in accordance with one or more embodiments described herein. Repetitive description of like elements employed in other embodiments described herein is omitted for sake of brevity.

In this implementation, instead of generating pulses using a single channel, the pulses can be generated using two channels, which is referred to as quadrature modulation or DRAG pulse shaping. The two channels of fast AWG are illustrated as a first AWG channel 602 and a second AWG channel 604, and can be used to generate X90 pulses for n qubits. This is a hardware savings as compared to traditional implementations that utilize one or two channels per qubit.

Further, for non-identical qubits/lines, two slow (DC) configurable attenuators can be utilized. For example, a first attenuator $606_1$ and a second attenuator $608_1$ can be used for the first qubit 508. Further, a first attenuator $606_2$ and a second attenuator $608_2$ can be used for the Nth qubit 510. In addition, one medium-rate (e.g., 1/pulse-rate) configurable phase shifter per qubit can be utilized to implement the Z gates, illustrated as respective phase shift operations $514_1$ and $514_2$.

In accordance with some implementations, if the attenuators of FIG. 5 and/or FIG. 6 can be configured at medium speed (e.g., 1/pulse-rate), then it can be possible to attempt to null out some amount of classical crosstalk by actively interfering the classical crosstalk out of the circuit. For example, the constant crosstalk environment created by the synchronized pulsing can reduce the effect of the residual crosstalk that is unable to be nulled out (e.g., calibrated out of the circuit).

Figure 7:
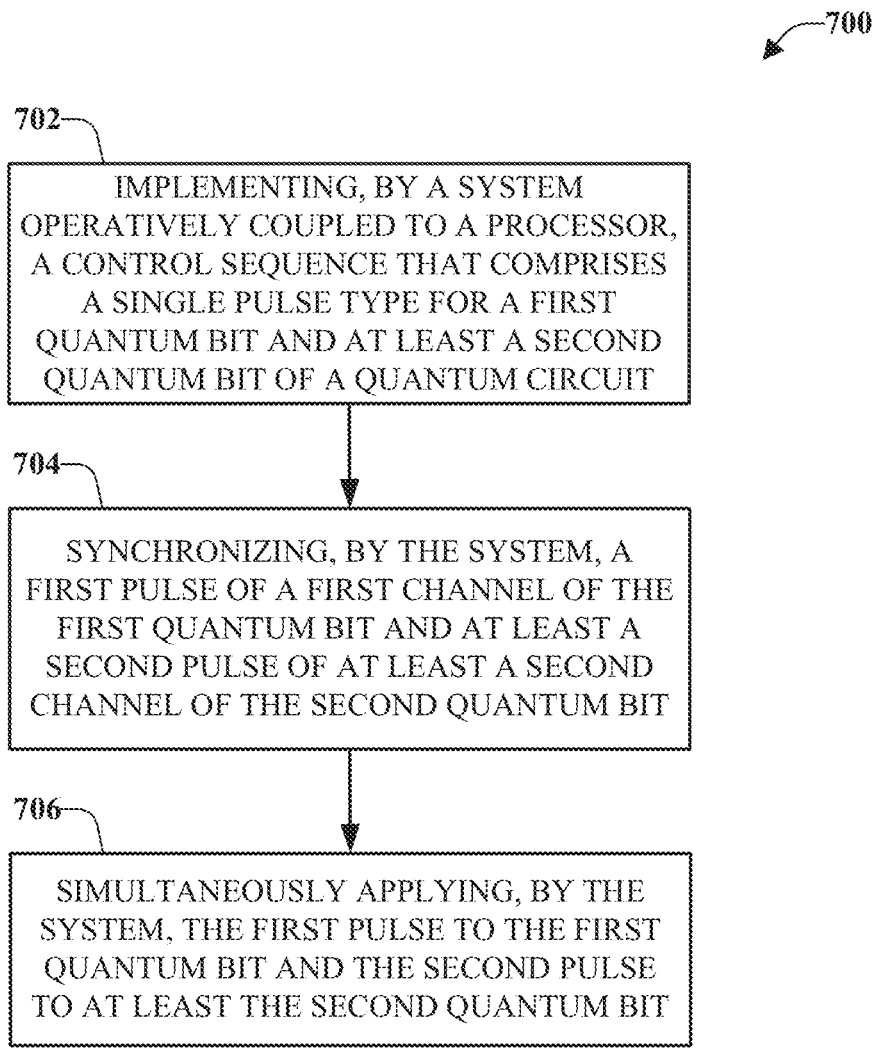
FIG. 7 illustrates a flow diagram of an example, non-limiting, computer-implemented method that facilitates reduction and/or mitigation of crosstalk in quantum bit gates in accordance with one or more embodiments described herein.

FIG. 7 illustrates a flow diagram of an example, non-limiting, computer-implemented method 700 that facilitates reduction and/or mitigation of crosstalk in quantum bit gates in accordance with one or more embodiments described herein. Repetitive description of like elements employed in other embodiments described herein is omitted for sake of brevity.

At 702 of the computer-implemented method 700, a system operatively coupled to a processor can implement a control sequence that comprises a single pulse type for a first quantum bit and at least a second quantum bit of a quantum circuit (e.g., via the signal generation component 102). According to an implementation, frame changes can be applied by the system to the control sequence. Further to this implementation, a combination of the control sequence and the frame changes can implement a single quantum bit SU(2) gate control.

A first pulse of a first channel of a first quantum bit and at least a second pulse of at least a second channel of the second quantum bit can be synchronized, at 704 of the computer-implemented method 700 (e.g., via the coordination component 104). According to some implementations, synchronizing the first pulse and at least the second pulse can produce continuous microwave pulsing. According to an implementation, the continuous microwave pulsing can render control crosstalk between the first quantum bit and at least the second quantum bit to be a similar crosstalk, which can be calibrated out of the circuit.

At 706 of the computer-implemented method 700, the system can simultaneously apply the first pulse to the first quantum bit and the second pulse to at least the second quantum bit (e.g., via the signal generation component 102). According to some implementations, the first pulse of the first quantum bit can be calibrated in a presence of at least the second pulse of at least the second quantum bit in the quantum circuit.

In some implementations, the computer-implemented method 700 can comprise implementing an identity gate via active idling. The active idling can eliminate an absence of pulses for other quantum bits within the quantum circuit. In an additional or alternative implementation, the computer-implemented method 700 can comprise implementing the active idling with a random active idle sequence. The random active idle sequence can facilitate a reduction of systematic errors within the quantum circuit.

Figure 8:
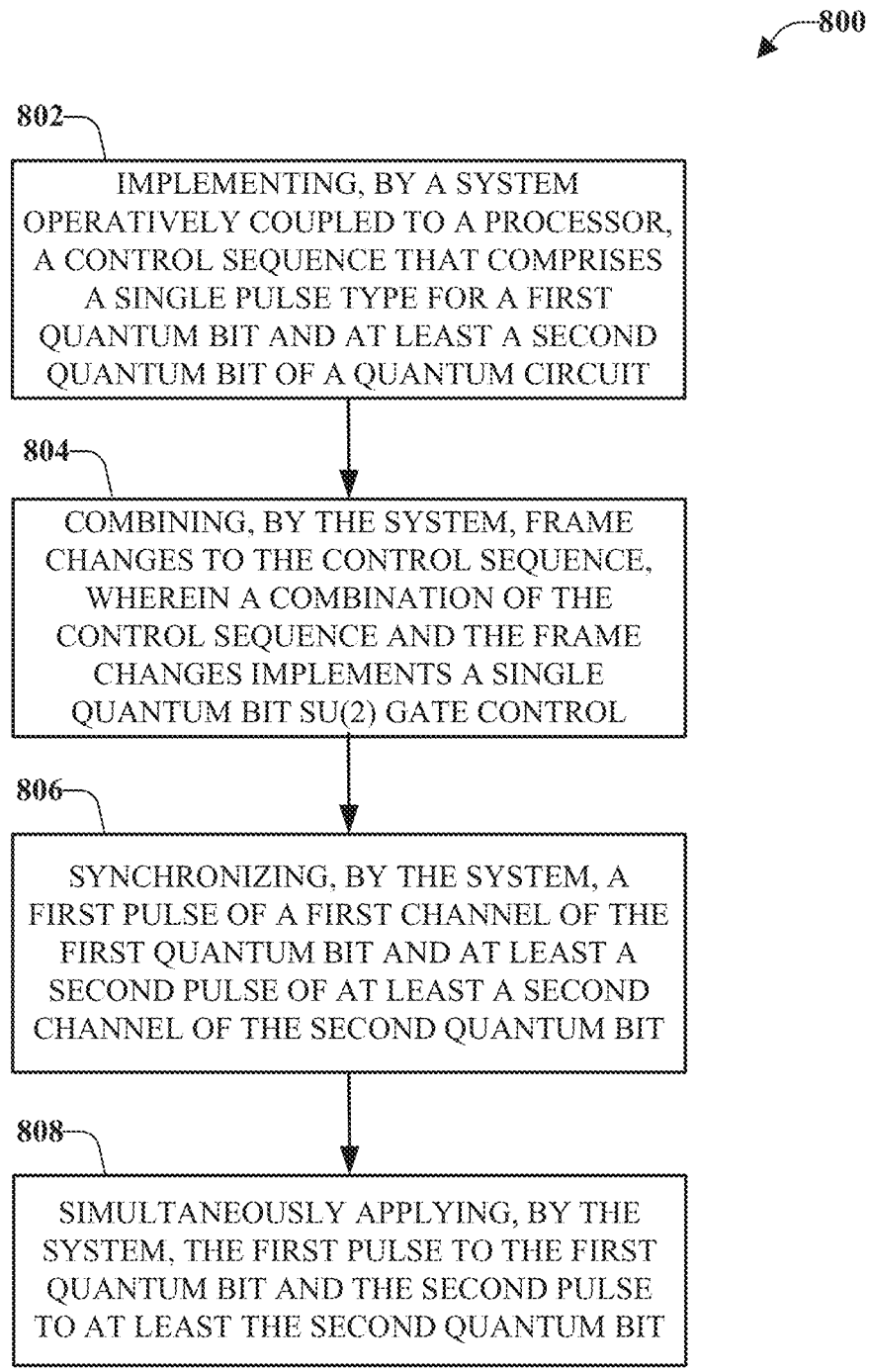
FIG. 8 illustrates a flow diagram of an example, non-limiting, computer-implemented method that facilitates eliminating crosstalk in qubit gates through the use of continuous microwave pulsing in accordance with one or more embodiments described herein.

FIG. 8 illustrates a flow diagram of an example, non-limiting, computer-implemented method 800 that facilitates eliminating crosstalk in qubit gates through the use of continuous microwave pulsing in accordance with one or more embodiments described herein. Repetitive description of like elements employed in other embodiments described herein is omitted for sake of brevity.

At 802 of the computer-implemented method 800, a system operatively coupled to a processor can implement a control sequence that can comprise a single pulse type for a first quantum bit and at least a second quantum bit of a quantum circuit (e.g., via the signal generation component). At 804 of the computer-implemented method 800, the system can combine frame changes to the control sequence (e.g., via the control component 204). A combination of the control sequence and the frame changes can implement a single quantum bit SU(2) gate control as discussed with respect to FIG. 3 and FIG. 4, for example.

At 806 of the computer-implemented method 800, the system can synchronize a first pulse of a first channel of a first quantum bit and at least a second pulse of at least a second channel of the second quantum bit (e.g., via the coordination component 104). Further, at 808 of the computer-implemented method 800, the system can simultaneously apply the first pulse to the first quantum bit and the second pulse to at least the second quantum bit. By simultaneously applying the pulses, the qubits can remain in lock step so that no matter what is occurring on the qubits, the qubits are having their respective X90 rotation applied simultaneously with the other qubits. Accordingly, the qubit gates can be synchronized so that the control crosstalk is the same no matter what the state of the qubit and the effects of crosstalk can be calibrated away (e.g., eliminate crosstalk in qubit gates).

Figure 9:
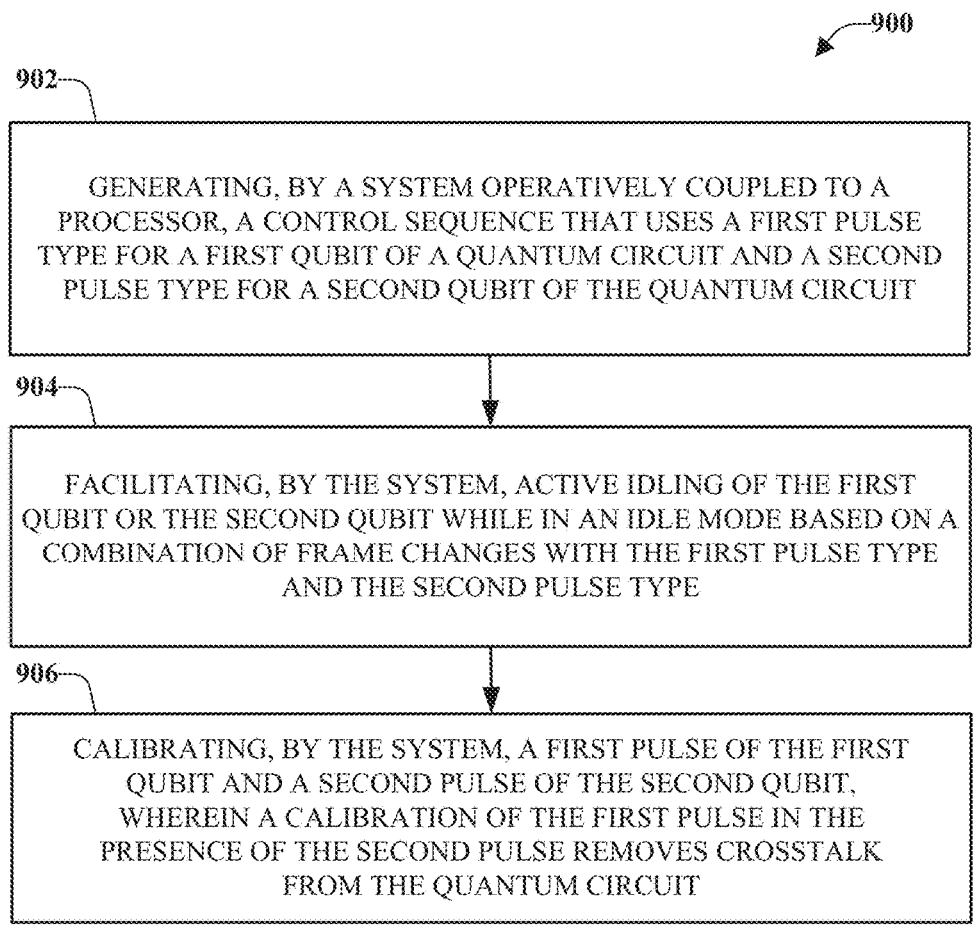
FIG. 9 illustrates a flow diagram of an example, non-limiting, computer-implemented method that facilitates an efficient implementation in accordance with one or more embodiments described herein

FIG. 9 illustrates a flow diagram of an example, non-limiting, computer-implemented method 900 that facilitates an efficient implementation in accordance with one or more embodiments described herein. Repetitive description of like elements employed in other embodiments described herein is omitted for sake of brevity.

At 902 of the computer-implemented method 900, a system operatively coupled to a processor can generate a control sequence that uses a first pulse type for a first qubit of a quantum circuit and a second pulse type for a second qubit of the quantum circuit (e.g., via the signal generation component 102). According to some implementations, a single AWG channel of a fast AWG can be used to generate X90 pulses for the qubits. According to another implementation, two channels of a fast AWG can be used to generate X90 pulses for the qubits.

Further, at 904 of the computer-implemented method 900, the system can facilitate active idling of the first qubit or the second qubit while in an idle mode (e.g., via the control component 204). The active idling can be facilitated based on a combination of frame changes with the first pulse type and the second pulse type.

At 906 of the computer-implemented method 900, the system can calibrate a first pulse of the first qubit and a second pulse of the second qubit. A calibration of the first pulse in the presence of the second pulse can remove crosstalk from the quantum circuit. The crosstalk can be various types of crosstalk including channel crosstalk and/or quantum crosstalk.

As discussed herein, qubit pulses can be calibrated in the presence of other qubit pulses. In accordance with some implementations, an identity gate can be implemented via active idling rather than absence of pulses. For example, phase of the active idle sequence can be randomized to reduce systematic errors. In another example, high-order echo/decoupling sequences can be used for higher-order error suppression in case of long idle periods.

Further, in accordance with various implementations, the hardware to generate a single X90 pulse template and distribute the pulse to all qubits simultaneously can be simplified. For example, there can be one configurable phase-shifter per qubit used to implement the frame changes from the Z gates. In addition, there can be DC-configurable amplitude scaling for non-identical qubits. In addition, an X90 pulse template can be constructed from Gaussian pulse. Further, an X90 pulse template can be DRAG: pulse and the respective derivative on two quadratures. In an example, quadratures can have separate amplitude scaling for non-identical qubits. Further, the pulse can still be Gaussian.

In accordance with another embodiment, a system can comprise a memory that stores computer executable components and a processor that executes the computer executable components stored in the memory. The computer executable components can comprise a signal generation component that generates a control sequence that uses a first pulse type for a first qubit of a quantum circuit and a second pulse type for a second qubit of the quantum circuit. The computer executable components can also comprise a coordination component that combines frame changes with the first pulse type and the second pulse type and facilitates active idling of the first qubit or the second qubit while in an idle mode. Further, the computer executable components can comprise a calibration component that can calibrates a first pulse of the first qubit in the presence of a second pulse of the second qubit. A calibration of the first pulse in the presence of the second pulse can remove crosstalk from the quantum circuit.

According to another embodiment, a computer-implemented method can comprise generating, by a system operatively coupled to a processor, a control sequence that uses a first pulse type for a first qubit of a quantum circuit and a second pulse type for a second qubit of the quantum circuit. The computer-implemented method can also comprise facilitating, by the system, active idling of the first qubit or the second qubit while in an idle mode based on a combination of frame changes with the first pulse type and the second pulse type. Further, the computer-implemented method can comprise calibrating, by the system, a first pulse of the first qubit and a second pulse of the second qubit. A calibration of the first pulse in the presence of the second pulse can remove crosstalk from the quantum circuit. In accordance with an implementation, calibrating the first pulse and the second pulse can comprise calibrating a first gate of the first qubit and calibrating a second gate of the second qubit.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
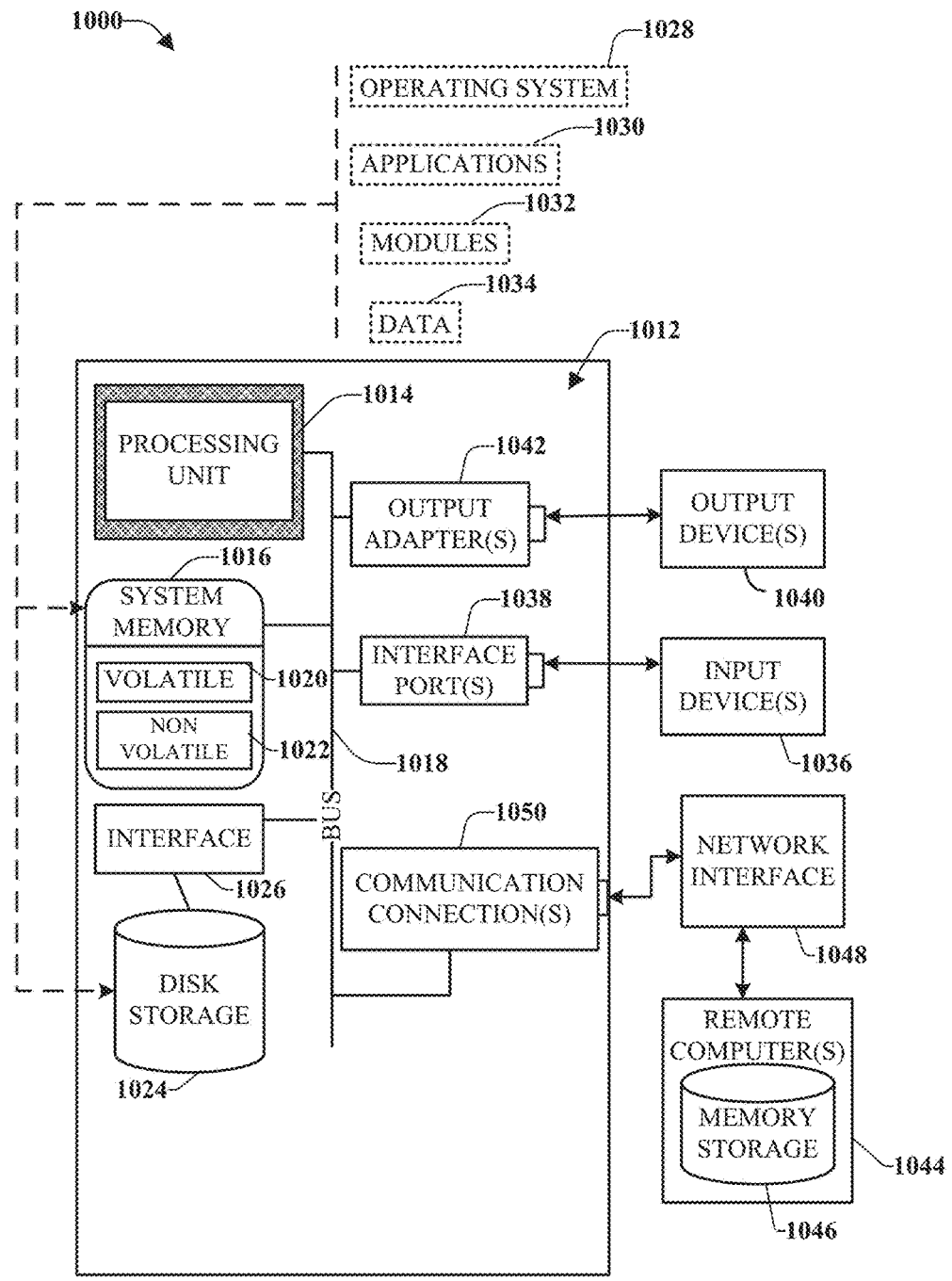
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/nonvolatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has,"

"possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
 a memory that stores computer executable components; and
 a processor that executes the computer executable components stored in the memory, wherein the computer executable components comprise:
  a signal generation component that implements a control sequence that comprises a single pulse type for a first quantum bit and at least a second quantum bit of a quantum circuit; and
  a coordination component that synchronizes a first pulse of a first channel of the first quantum bit and at least a second pulse of at least a second channel of the second quantum bit, wherein the coordination component simultaneously applies the first pulse to the first quantum bit and at least the second pulse to at least the second quantum bit.

2. The system of claim 1, the computer executable components further comprise:
 a control component that combines frame changes to the control sequence, wherein a combination of the control sequence and the frame changes implements a single quantum bit SU(2) gate control.

3. The system of claim 1, wherein the coordination component calibrates the first pulse of the first quantum bit in a presence of at least the second pulse of at least the second quantum bit in the quantum circuit.

4. The system of claim 1, wherein the coordination component implements an identity gate via active idling, wherein the active idling eliminates an absence of pulses for other quantum bits within the quantum circuit.

5. The system of claim 4, wherein the coordination component implements the active idling with a random active idle sequence, and wherein the random active idle sequence facilitates a reduction of systematic errors within the quantum circuit.

6. The system of claim 1, wherein the coordination component uses high-order echo/decoupling sequences for higher-order suppression based on an idle period being longer than a defined idle time.

7. The system of claim 1, wherein a synchronization of the pulses facilitates continuous microwave pulsing.

8. The system of claim 7, wherein the continuous microwave pulsing reduces crosstalk in one or more quantum bit gates of the quantum circuit.

9. The system of claim 7, wherein the continuous microwave pulsing renders control crosstalk between the first quantum bit and at least the second quantum bit to be a similar crosstalk, and wherein the computer executable components further comprise a calibration component that selectively removes the control crosstalk from the quantum circuit.

10. The system of claim 9, wherein the continuous microwave pulsing renders the control crosstalk as the similar crosstalk irrespective of a first state of the first quantum bit and a second state of at least the second quantum bit.

11. A computer-implemented method, comprising:
 implementing, by a system operatively coupled to a processor, a control sequence that comprises a single pulse type for a first quantum bit and at least a second quantum bit of a quantum circuit;
 synchronizing, by the system, a first pulse of a first channel of the first quantum bit and at least a second pulse of at least a second channel of the second quantum bit; and
 simultaneously applying, by the system, the first pulse to the first quantum bit and the second pulse to at least the second quantum bit.

12. The computer-implemented method of claim 11, further comprising:
 combining, by the system, frame changes to the control sequence, wherein a combination of the control sequence and the frame changes implements a single quantum bit SU(2) gate control.

13. The computer-implemented method of claim 11, further comprising:
 calibrating, by the system, the first pulse of the first quantum bit in a presence of at least the second pulse of at least the second quantum bit in the quantum circuit.

14. The computer-implemented method of claim 11, further comprising:
 implementing an identity gate via active idling, wherein the active idling eliminates an absence of pulses for other quantum bits within the quantum circuit.

15. The computer-implemented method of claim 14, further comprising:
 implementing the active idling with a random active idle sequence, wherein the random active idle sequence facilitates a reduction of systematic errors within the quantum circuit.

16. The computer-implemented method of claim 11, wherein the synchronizing the first pulse and at least the second pulse produces continuous microwave pulsing.

17. A computer program product that removes crosstalk in quantum bit gates, the computer program product comprising a computer readable storage medium having program instructions embodied therewith, the program instructions are executable by a processor to cause the processor to:
 implement a control sequence that comprises a single pulse type for a first quantum bit and at least a second quantum bit of a quantum circuit;
 synchronize a first pulse of a first channel of the first quantum bit and at least a second pulse of at least a second channel of the second quantum bit; and
 simultaneously apply the first pulse to the first quantum bit and the second pulse to at least the second quantum bit.

18. The computer program product of claim 17, wherein the program instructions cause the processor to:
 calibrate the first pulse of the first quantum bit in a presence of at least the second pulse of at least the second quantum bit in the quantum circuit.

19. The computer program product of claim 17, wherein the program instructions cause the processor to:

implement an identity gate via active idling, wherein the active idling eliminates an absence of pulses for other quantum bits within the quantum circuit.

20. The computer program product of claim 17, wherein the program instructions cause the processor to:
produce continuous microwave pulsing based on a synchronization of the first pulse and at least the second pulse.

21. A system, comprising:
an electrical waveform generator that generates a single channel waveform to facilitate distribution to qubits of a quantum circuit;
one or more configurable amplitude scalers that scale the single channel to facilitate calibration of the qubits; and
one or more configurable phase-shifters that implement frame changes at the qubits, wherein a first configurable amplitude scaler of the one or more configurable amplitude scalers and a first configurable phase-shifter of the one or more configurable phase-shifters are utilized for a first qubit of the qubits, and wherein a second configurable amplitude scaler of the one or more configurable amplitude scalers and a second configurable phase-shifter of the one or more configurable phase-shifters are utilized for a second qubit of the qubits.

22. The system of claim 21, wherein the waveform generator constructs a single pulse template from a Gaussian pulse.

23. The system of claim 21, wherein the configurable phase-shifters implement frame changes from respective phase rotations of the qubits.

24. A system, comprising:
an arbitrary waveform generator that generates a two channel waveform to generate pulses for qubits of a quantum circuit;
configurable attenuators that scale the pulses to facilitate calibration of the qubits, wherein pairs of attenuators of the configurable attenuators are implemented at respective qubits of the qubits; and
configurable phase-shifters that implement frame changes at the qubits, wherein respective phase-shifters of the configurable phase-shifters are implemented at respective qubits of the qubits.

25. The system of claim 24, wherein the arbitrary waveform generator generates a single pulse template, wherein the single pulse template is based on two channel pulse shaping.

* * * * *